United States Patent

Dessauer

[15] 3,661,461

[45] May 9, 1972

[54] CO-IRRADIATION SYSTEM FOR PRODUCING POSITIVE IMAGES

[72] Inventor: Rolf Dessauer, Wilmington, Del.

[73] Assignee: E. I. du Pont de Nemours and Company, Wilmington, Del.

[22] Filed: Nov. 26, 1969

[21] Appl. No.: 880,301

[52] U.S. Cl. ....................................355/37, 250/42, 355/43, 355/67, 355/71, 355/80

[51] Int. Cl. ........................................................G03b 27/76

[58] Field of Search ......................355/36, 37, 43, 67, 71, 80; 250/71, 42

[56] References Cited

UNITED STATES PATENTS 3,085,469 4/1963 Carlson....................................355/37

*Primary Examiner*—John M. Horan
*Assistant Examiner*—Richard A. Wintercorn
*Attorney*—Gary A. Samuels

[57] ABSTRACT

Method for producing positive images by irradiating photoimageable and photodeactivatable compositions which are characterized by forming color on irradiation with light in a first wavelength range and by being deactivated against color formation on irradiation with light in a different second wavelength range. The method comprises simultaneously exposing such composition disposed as an image-capture surface to radiations in both wavelength ranges, with 1. the deactivating radiation being applied patternwise according to the desired image to be captured,
2. the color-forming radiation being applied over the entire surface to be imaged, and
3. the intensities and the relative intensities of the two radiations being such that
   i. the deactivating radiation is itself effective for deactivation and
   ii. the color-forming radiation is itself effective to cause color formation in other than the co-struck areas but is ineffective in the presence of the deactivating radiation in the co-struck areas to cause substantial color formation.

The composition used is a mixture of

A. color forming components which are responsive to said first wavelength range and thereby produce a first photo-induced oxidation-reduction reaction, and B. deactivating components which are responsive to said second wavelength range and thereby produce a deactivating agent by a second oxidation-reduction reaction, said deactivating agent thus produced being a stronger reducing agent than the reductant member of the color-forming components and thereby preventing the color-forming reaction when the composition is subsequently exposed to the first wavelength range.

6 Claims, 4 Drawing Figures

INVENTOR

ROLF DESSAUER

BY Gary A Samuels

ATTORNEY

INVENTOR
ROLF DESSAUER

BY Gary A Samuels
ATTORNEY

CO-IRRADIATION SYSTEM FOR PRODUCING POSITIVE IMAGES

BACKGROUND OF THE INVENTION

1. Field of the Invention

This invention relates to an exposure method and apparatus for producing positive images, i.e. colored images having a relatively light-stable background. More specifically, the invention is directed to such method and apparatus involving photosensitive compositions which are activatable for color formation upon irradiation by light in one range of wavelengths and deactivatable against color formation upon irradiation by light in another range of wavelengths. The photosensitive composition is exposed so as to yield as a positive reproduction of an original image by subjecting the composition to an overall exposure of the color-forming (imaging) radiation while simultaneously exposing it to a pre-selected pattern of the deactivating radiation, in a controlled manner. Thus in the pre-selected pattern areas of the composition the composition is co-irradiated, or co-struck, by both the activating radiation and the deactivating radiation, and in these areas deactivation takes place.

2. Description of the Prior Art

MacLachlan U. S. Pat. No. 3,390,996, Cescon U. S. Pat. No. 3,390,994 and Strilko U. S. Pat. Application Ser. No. 740,476, filed June 27, 1968, now U. S. Pat. No. 3,579,342 all assigned to the assignee herein, disclose light-activatable color forming photosensitive compositions, such as hexaarylbiimidazoles and leuco dyes, which form color upon irradiation with ultraviolet light, and which can be deactivated against such color formation by incorporating therewith light-activatable oxidation-reduction systems, such as a visible light-activatable quinone in combination with a source of abstractable hydrogen such as an aliphatic polyether or an alkyl nitrilotrialkanoate. These compositions will be referred to herein as "photosensitive compositions. " Irradiation of such systems with ultraviolet light produces color corresponding to the dye form of the leuco dye component; on the other hand, irradiation with visible light deactivates the color forming components against color formation. Deactivation is attributable to in situ formation of a hydroquinone of the quinone employed, which preferentially reduces photoactivated hexaarylbiimidazole before the bimidazole can oxidize the leuco dye to color.

The above patents and patent application describe photoimaging and photofixing processes which involve sequentially exposing the photoimageable/photodeactivatable photosensitive compositions to the two radiations, in two distinct steps, with the first applied imagewise, to produce a negative or a positive of the original image, depending on the order of the exposure.

In the above disclosed systems, photodeactivation is normally much slower than photo-color formation, and is the limiting factor determining the speed with which photosensitive articles involving such compositions can be imaged and fixed. Further, access time to a positive reproduced image is the sum of the time required for the sequential deactivation and color formation steps. In many applications it is desirable to reduce this access time to the final product. It is also desirable to produce dry, hard copy directly and quickly from imaged film, particularly as positive blowback, i.e. a directly readable enlargement from microfilm.

Accordingly it is an object of this invention to provide a simplified singular exposure method and apparatus for producing positive images from the above described prior art photosensitive compositions, especially such a method for producing dry hard copy as positive prints on paper or film directly from positive or negative films, either black or white, or color transparencies and which is adaptable to the blowback (enlargement) of microfilm as a direct print.

SUMMARY OF THE INVENTION

The process aspect of the invention comprises a process for creating a positive image on a photoimageable and photodeactivatable composition, which composition comprises an admixture of A. a color-forming component comprising (1) an organic color generator and (2) a photoactivatable first oxidant which can oxidize the color generator to a colored compound on irradiating the said first oxidant with light of a first wavelength range, and B. a deactivating component comprising (1) a second photoactivatable oxidant which is activatable by light of a second wavelength range, is not an oxidant for the color generator but is reducible when activated by light of said second wavelength range, and (2) a reductant which is a reductant for the s second oxidant but not for the first oxidant, said reductant being capable of reducing the second oxidant on irradiation by light of said second wavelength range to a second reductant which is a reductant for the photoactivated first oxidant, whereby the second reductant prevents the color forming reaction between the color generator and the first oxidant;

which process comprises simultaneously exposing said composition disposed on an image-capture surface to radiation of the first and the second wavelength ranges, said radiation of the first wavelength range being directed to the entire surface to be radiated and being of an intensity effective to cause color formation in areas of said surface other than coirradiated areas but ineffective to cause color formation in areas of said surface that are coirradiated with the radiation of the second wavelength range, said radiation of the second wavelength range being directed patternwise to said surface to be radiated according to the image to be captured and being of an intensity effective to prevent color formation in areas of said surface that are subjected to said second radiation.

The apparatus aspect of the invention comprises a system for irradiating the composition defined above which comprises 1. means for positioning a photosensitive composition presenting an image-receptive surface prepared from the composition described above,
2. a first photoradiation source and means for directing said photoradiation in a first wavelength in a substantially uniform flux density over the entire surface of the photosensitive composition,
3. a second photoradiation source and means for directing said photoradiation in a second wavelength range in a substantially uniform flux density over the entire surface of the photosensitive composition,
4. a radiation modulating means interposed between the surface of the photosensitive composition and the photoradiation from the second source so as to create a pattern of said photoradiation on said surface, said modulating means containing areas which are essentially transparent to said second radiation and areas which are essentially opaque to said radiation, said first and second radiation sources and directing means and said modulator being positioned with respect to the surface of the photosensitive composition and to each other such that a. both radiations in the absence of the modulator can irradiate the same total surface area to be imaged, and
b. the modulator screens an image-creating portion of said second radiation without screening the first radiation from the photosensitive surface of said composition.

DESCRIPTION OF THE INVENTION

The term "deactivation" as used herein refers to the prevention of color formation in the photoimageable photodeactivated composition. Deactivation occurs when the composition is subjected to light, as defined, sufficient to render the exposed area of the composition relatively insensitive to color-inducing radiation. The degree of deactivation achieved depends on the intensity of the deactivating radiation and the duration of the exposure. The thus exposed material is "deactivated" or "fixed," with the deactivated area serving as the background against which the color (imaged) area is to be viewed. The background's resistance to form color on subsequent exposure depends in general on the intensity of the color-forming light and the duration of the exposure. Practically speaking, with reference to the preferred compositions used in the invention which are responsive to ultraviolet light (for color formation) and to visible light (for deactivation), the term "deactivated" as used herein means that the composition is rendered practically insensitive to color formation under ordinary use exposures to roomlight, daylight and sunlight, which normally contain ultraviolet components.

The term "color formation," sometimes called image formation herein, refers to the process by which the photosensitive composition is subjected to a light exposure as defined sufficient to produce a colored area visible against the deactivated area.

The co-irradiation (i.e., the simultaneous irradiation of certain areas of a surface by both activating and deactivating radiation) process of this invention affords several new and important results and advantages over the stepwise sequential irradiation process of the prior art. Access time to the final images and fixed product is substantially reduced, largely because the deactivating and color forming radiation exposures are effected simultaneously rather than sequentially, and in part because deactivation by co-irradiation appears to be faster than deactivation by sequential irradiation. Moreover, by using intense deactivating radiation, deactivation can take place in substantially the same time as the normally photographically faster color formation. Surprisingly, too, co-irradiation produces less color in the deactivated areas than sequential irradiation. Thus, contrast between the colored and deactivated areas appears better than that observed with the same exposure applied sequentially.

Figure 1:
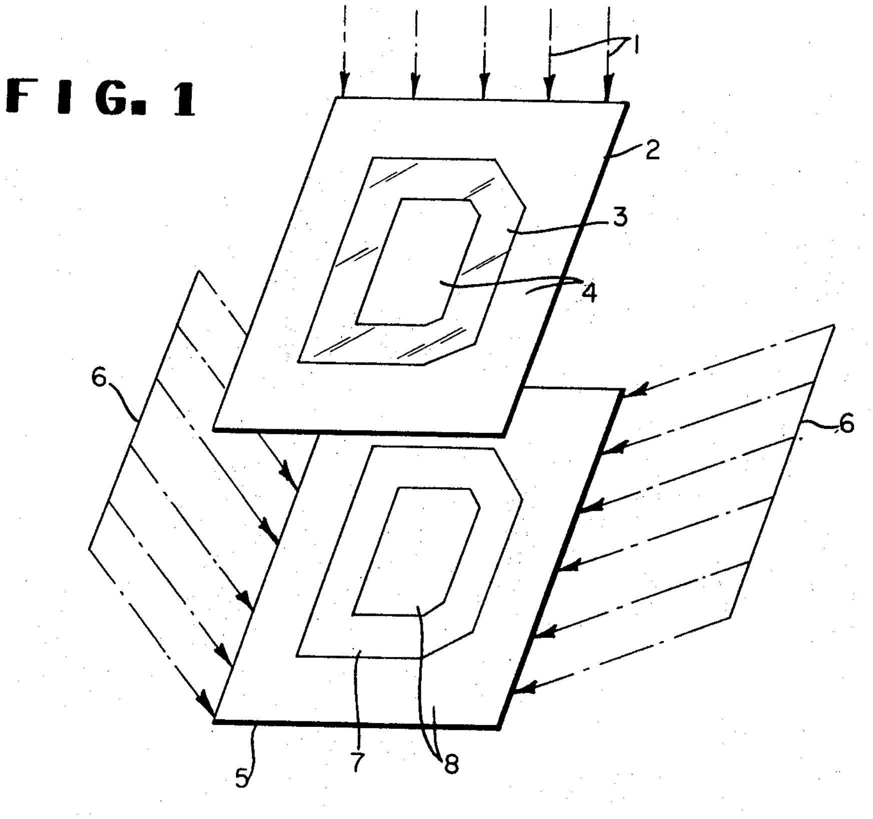
FIG. 1 schematically illustrates the general simultaneous exposure method of the invention for non-reversal fixed image formation.

Referring now to the drawings, FIG. 1 depicts schematically the process of the invention. The figure depicts the passing of deactivating, e.g. visible, light radiation 1 through a pattern-creating light modulator 2, shown in the figure as a stencil having area 3 transparent to light radiation 1 and area 4 opaque to light radiation 1. The radiation 1 passes through area 3 and impinges on the surface 5 of a photoimageable/photodeactivatable composition as defined herein, thereby creating a pattern defined by area 7. Simultaneously color-inducing, e.g. ultraviolet, light radiation 6 is directed over the entire surface 5, including area 7, thereby producing color in area 8 of surface 5 but substantially less or no color in area 7 (which has been simultaneously co-struck by deactivating light radiation 1).

The light sources are pre-selected such that the photosensitive composition's deactivating components are responsive to light 1 and the color-forming components are responsive to light 6 as defined. Positioning of the sources (not shown) of radiations 1 and 6 and the angles at which they strike the surface 5 of the photosensitive composition are not critical provided that (a) the deactivating radiation passes through modulator 2 before it strikes surface 5, forming deactivated area 7, and (b) the color-inducing radiation can strike the entire surface 5 area. Preferably the light sources are positioned such that the deactivating and color-forming radiations can be uniformly distributed over the photosensitive surface 5 according to the indicated patterns.

The intensities of the deactivating (the second wave-length range) and color-forming radiations (first wavelength range) 1 and 6 respectively, and the exposure times are chosen such that color is produced in area 8 with substantially little or no color in co-struck area 7. To maximize speed and shorten access time to the reproduced image, the deactivating radiation can be as intense as feasible, consistent with the stability of the materials involved to such radiation. Given a particular deactivating light radiation exposure, the color-forming light radiation exposure can be varied, depending on the relative deactivation and color formation rates of the particular photosensitive composition involved and on the effect desired. The color-forming radiation should be sufficiently intense of course to produce readout, i.e., visible, amounts of color in the desired areas 8 but not so intense as to cause substantial color formation in the co-struck area 7 and interfere with image contrast and readout. A key feature of this invention is that the color-inducing radiation intensity is readily controlled so as to produce substantially little or no color in the co-struck deactivated areas. Surprisingly, in fact, co-irradiation produces images with better backgrounds and consequently better contrast than the sequential positive imaging process involving the same exposure conditions but patternwise irradiation first with deactivating light followed by an overall exposure with color forming light.

It will be noted that FIG. 1 shows light modulator 2 and photosensitive surface 5 as substantially parallel planes spaced apart to permit flooding of surface 5 with color-inducing radiation 6. Where it is possible to expose the surface 5 to color-inducing radiation without interference from the modulator, there is no need to space surface 5 apart from modulator 2. For example, where areas 3 and 4, that is, the entire modulator 2 are transparent to color-forming light 6, surface 5 can be simultaneously irradiated from the same direction, as in contact printing, with both radiations 1 and 6 through modulator 2 produce a fixed image in one step. As a further example where the photosensitive composition is disposed as a thin layer coating on a substrate (film, quartz or glass) that is essentially transparent to color-inducing wavelengths, the photosensitive composition can be placed between the modulator 2 and the color-inducing light source 6. In other words the deactivating and colorforming radiations can be simultaneously applied from opposite directions.

Figures 2, 3:
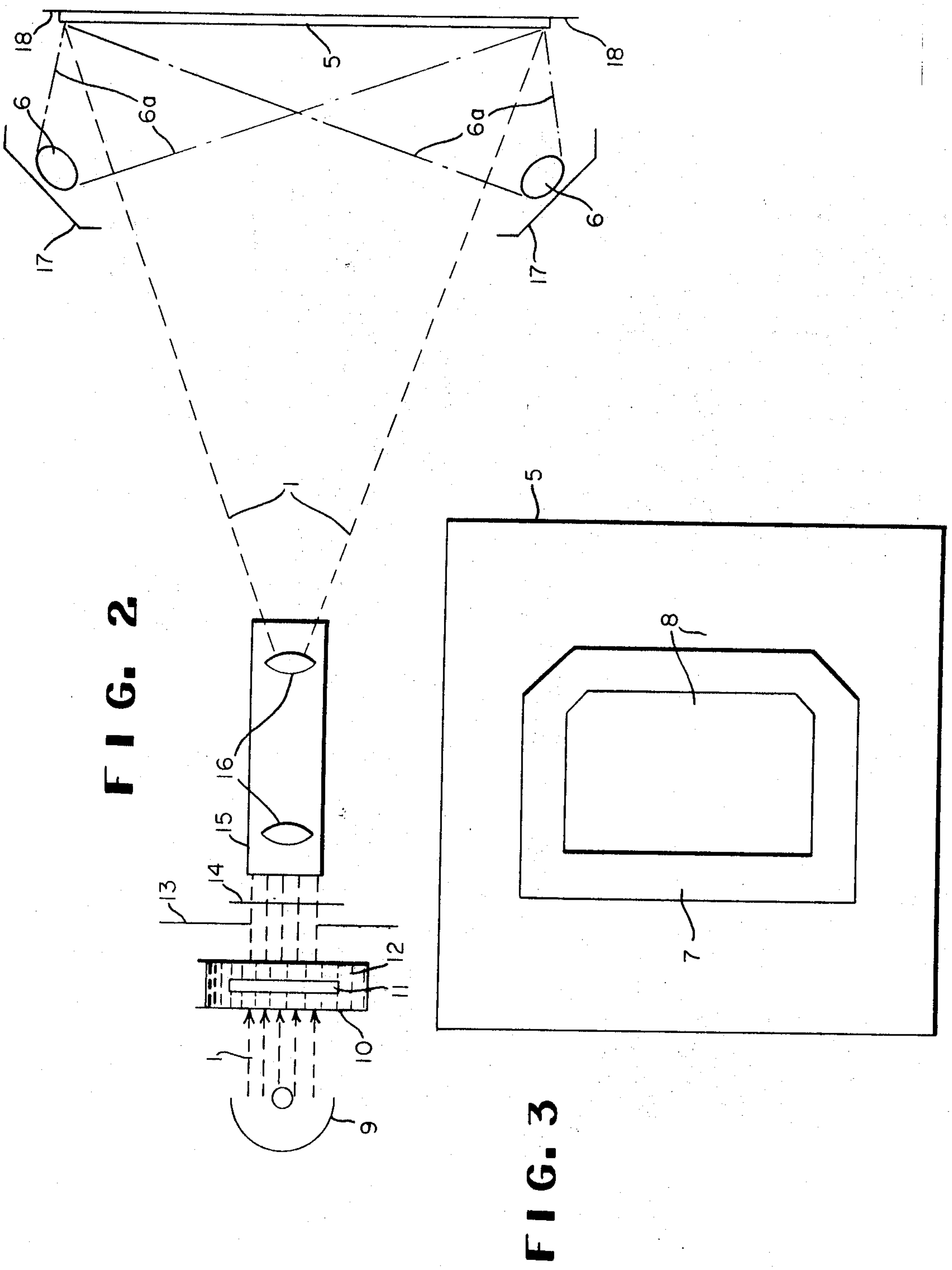
FIG. 2 illustrates a projection enlargement device embodying the principal features of the FIG. 1 invention scheme and particularly adapted for blowback of microfilm as hard copy.
FIG. 3 shows a full-face view of a projected, enlarged image developed and fixed by simultaneous imaging and fixing according to the invention method.

FIGS. 2 and 3 illustrate a microfilm blowback device embodying the principal features of the invention process. FIG. 2 shows a side view of the overall system, while FIG. 3 shows a full face view of the projected image. The system includes projection lamp 9 (the source of deactivating light 1 of the figure); an air-cooled filter cell 10, containing light filter 11 in light-transparent infrared absorbing medium 12 (e.g., water); film gate 13; microfilm 14 (serving as the modulator 2 of FIG. 1) bearing the image to be blown back and reproduced as hard copy; projection lens assembly 15, including lenses 16, for projecting the film 14 image as an enlargement onto viewing screen 18 which is coated on surface 5 with the photosensitive image-capture material or which serves as a background for coated film or paper; color-inducing radiation sources 6, with reflectors 17, to direct a flood of light 6a over surface 5.

Screen 18 which may function as a viewing screen and a mechanical support for the coating of the photosensitive composition to present image-capture surface 5, is normally disposed such that the viewing (recording) plane is perpendicular to the directional axis of the patternwise projected deactivating light 1. Light sources 6 with reflectors 17 are positioned just outside the path of deactivating light 1 and are sized with respect to one another such that the light *6a* irradiating from source 6 is substantially uniform over surface 5.

Filter cell 10 is designed primarily to prevent film 14 from overheating (melting) and to screen out "unusable" radiation i.e. radiation other than radiation that the photosensitive composition can absorb and utilize in the deactivating process. The cell also serves to minimize the quantity of heat absorbed by the film. For example, in a preferred embodiment which involves projecting of a microfilm image with relatively intense blue light, a filter is employed which passes such blue light. Also, the filter is cooled by immersion in water. Other light filters and compatible heat-absorbing media may be employed, of course, depending on the particular photoimageable/photodeactivatable composition used and the sensitivity of the light modulator to heat. For example dichroic mirrors used either in the transmission or reflection mode may be substituted or used in addition to filter cell 10.

Figure 4:
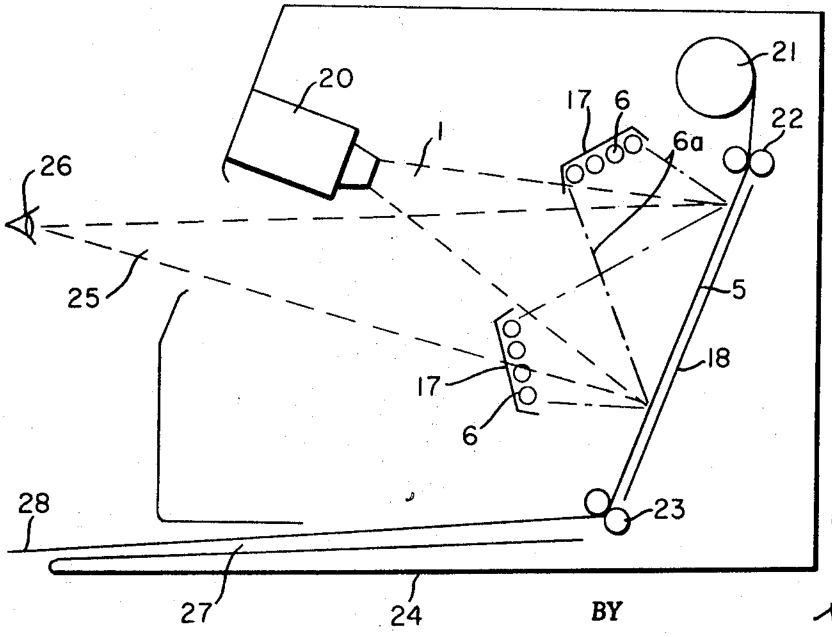
FIG. 4 is a novel viewer-printer, for microfilm viewing and blowback hard copy generation, which incorporates the system of FIGS. 2 and 3 and provides for positive viewing of the image to be copied in high ambient light and for simultaneous viewing and hard copy generation.

The viewer-printer of FIG. 4 comprises projector 20 (which contains elements 9 through 16 of FIG. 2) batteries of lamps 6 with reflectors 17; viewing screen 18; roll stock 21, which supplies paper or film carrying a surface coating 5 of a photosensitive composition as described herein; roll stock feed mechanism 22; eject mechanism 23; housing 24 with viewing tunnel 25 allowing some ambient visible light (e.g. daylight, artificial roomlight) to enter the housing sufficient to provide visual access to screen 19 by viewer 26; and exit slot 27 for hard copy 28 i.e. photoimaged and photofixed composition paper or film. Feed mechanism 22 can be provided with a cutting means to deliver copy 28 as individual sheets (enlarged film frames) instead of a continuous printout.

A viewer-printer similar to that shown in FIG. 4 may be provided with separate viewing and printing stations, and the projected beam 1 directed to either one or the other by the insertion, removal, or rotation of suitably placed mirrors. In such a device, the printing station can be shielded completely from room light so that the image-receiving paper may be left in place on the printing platen until exposure is desired. Furthermore, viewing can be carried out on a rear-projection screen, which has the advantage of allowing closer inspection than does a reflective screen.

In the viewer-printer in which the viewing and printing stations are separated, a dichroic mirror may be placed in the projected beam so that only those wavelengths of light effective in causing deactivation are directed to the printing station while other visible wavelengths are at the same time directed to the viewing screen. In such a device, it would then be possible to view and print simultaneously.

It will be apparent from the above that the coirradiation method coupled with the photosensitive compositions herein defined provides a consistent "positive" system for microfilm duplication and blowback. Because co-irradiation produces positive images, i.e. duplicates the master exactly, it is directly applicable to positive, i.e. "black on white," microfilm, and yields positive visual blowback and positive hard copy. In duplicating film directly, it eliminates the prior art need to first convert the original negative into a duplicate positive for subsequent duplication of negative microfilm which is the form normally distributed for use.

As previously stated, the degree of deactivation obtained in one composition depends on the intensity of the deactivating radiation and the duration of the exposure. By reducing one or the other, so-called "partial deactivation" can be obtained. In other words, by reducing the amount of deactivating radiation in the process, an imaged, but partially deactivated composition can be obtained. Information can then be "added on" by subjecting the partially deactivated area to a patternwise (information stencil) beam of imaging radiation.

THE PHOTOSENSITIVE COMPOSITION EMPLOYED

As described above in the Summary, the composition comprises a color-forming component and a deactivating component.

The color-forming component comprises a color generator and a first photoactivatable oxidant.

The first photoactivatable oxidant is preferably a 2,2',4,4',5,5'-hexaarylbiimidazole, sometimes called a 2,4,5-triarylimidazolyl dimer. They are photodissociable to the corresponding triarylimidazolyl radicals. These hexaarylbiimidazoles absorb maximally in the 255–275 mu region, and usually show some, though lesser absorption in the 300–375 mu region. Although the absorption bands tend to tail out to include wavelengths as high as about 420 mu, they thus normally require light rich in the 255–375 mu wavelengths for their dissociation. Thus the radiation of the first wavelength range used in the process of this invention is ultraviolet light.

The hexaarylbiimidazoles can be represented by the formula

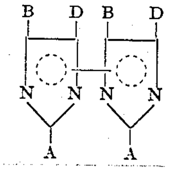

wherein A, B and D represent aryl groups which can be the same or different, carbocyclic or heterocyclic, unsubstituted or substituted with substituents that do not interfere with the dissociation of the hexaarylbiimidazole to the triarylimidazolyl radical or with the oxidation of the leuco dye, and each dotted circle stands for four delocalized electrons (i.e., two conjugated double bonds) which satisfy the valences of the carbon and nitrogen atoms of the imidazolyl ring. The B and D aryl groups can each be substituted with 0–3 substituents and the A aryl groups can be substituted with 0–4 substituents.

The aryl groups include one- and two-ring aryls, such as phenyl, biphenyl, naphthyl, pyridyl, furyl and thienyl. Suitable inert (i.e., non-interfering with the processes described herein) substituents on the aryl groups have Hammett sigma (para) values in the −0.5 to 0.8 range, and are other than hydroxyl, sulfhydryl, amino, alkylamino or dialkylamino groups. Representative substituents and their sigma values, (relative to H = 0.00 ), as given by Jaffe, Chem. Rev. 53, 219–233 (1953) are: methyl (−0.17), ethyl (−0.15), t-butyl (−0.20), phenyl (0.01), butoxy (−0.32), phenoxy (−0.03), fluoro (0.06), chloro (0.23), bromo (0.23), iodo (0.28), methylthio (−0.05), nitro (0.78), ethoxycarbonyl (0.52), and cyano (0.63). The foregoing substituents are preferred; however, other substituents which may be employed include trifluoromethyl (0.55), chloromethyl (0.18), carboxyl (0.27), cyanomethyl (0.01), 2-carboxyethyl (−0.07), and methylsulfonyl (0.73). Thus, the substituents may be halogen, cyano, lower hydrocarbyl (including alkyl, halo alkyl, cyanoalkyl, hydroxyalkyl and aryl), lower alkoxy, aryloxy, lower alkylthio, arylthio, sulfo, alkyl sulfonyl, arylsulfonyl, and nitro, and lower alkylcarbonyl. In the foregoing list, alkyl groups referred to therein are preferably of 1–6 carbon atoms; while aryl groups referred to therein are preferably of 6–10 carbon atoms.

Preferably the aryl radicals are carbocyclic, particularly phenyl, and the substituents have Hammett sigma values in the range −0.4 to +0.4, particularly lower alkyl, lower alkoxy, chloro, fluoro, bromo and benzo groups.

In a preferred hexaarylbiimidazole class, the 2 and 2' aryl groups are phenyl rings bearing an ortho substituent having a Hammett sigma value in the range −0.4 to +0.4. Preferred ortho substituents are fluorine, chlorine, bromine, methyl and methoxy groups, especially chloro. Such biimidazoles tend less than others to form color when the light-sensitive compositions are applied to and dried on substrates at somewhat elevated temperatures, e.g., in the range 70°–100° C.

Most preferably, the 2-phenyl ring carries only the above-described ortho group, and the 4- and 5-phenyl rings are either unsubstituted or substituted with lower alkoxy.

Preferred hexaarylbiimidazoles include 2,2'-bis(o-chlorophenyl-4,4',5,5'-tetraphenylbiimidazole and 2,2'-bis-(o-chlorophenyl)- 4,4',5,5'-(m-methoxyphenyl)biimidazole.

Representative hexacrylbiimidazoles which may be employed in this invention include: 2,2'-bis(o-bromophenyl)-4,4',5,5'-tetraphenylbiimidazole, 2,2'-bis(p-bromophenyl)-4,4',5,5'-tetraphenylbiimidazole, 2,2'-bis(p-carboxyphenyl)-4,4',5,5'-tetraphenylbiimidazole, 2,2'-bis(o-chlorophenyl)-4,4',5,5'-tetrakis(p-methoxyphenyl)-biimidazole, 2,2'-bis(o-chlorophenyl)-4,4',5,5'-tetraphenylbiimidazole, 2,2'-bis(p-chlorophenyl)-4,4',5,5'-tetrakis(p-methoxyphenyl)-biimidazole, 2,2'-bis(p-cyanophenyl)-4,4',5,5'-tetrakis(p-methoxyphenyl)-biimidazole, 2,2'-bis(2,4-dichlorophenyl)-4,4',5,5'2,2'-bis(2,4-dimethoxyphenyl)-4,4',5,5'-tetraphenylbiimidazole 2,2'-bis(o-ethxoyphenyl)-4,4',5,5'-tetraphenylbiimidazole, 2,2'-bis(m-fluorophenyl)-4,4',5,5'-tetraphenylbiimidazole, 2,2'-bis(o-fluorophenyl)-4,4',5,5'-tetraphenylbiimidazole, 2,2'-bis(p-fluorophenyl)-4,4',5,5'-tetraphenylbiimidazole, 2,2'-bis(o-hexoxyphenyl)-4,4',5,5'-tetraphenylbiimidazole, 2,2'-bis)o-hexylphenyl)-4,4',5,5'-tetrakis(p-methoxyphenyl)-biimidazole, 2,2'-bis(3,4-methylenedioxyphenyl)-4,4',5,5'-tetraphenyl-biimidazole, 2,2'-bis(o-chlorophenyl)-4,4',5,5'-tetrakis(m-methoxyphenyl) biimidazole, 2,2'-bis(o-chlorophenyl)-4,4',5,5'-tetrakis[m-(betaphenoxy-ethoxyphenyl)]biimidazole, 2,2'-bis(2,6-dichlorophenyl)-4,4',5,5'-tetraphenylbiimidazole, 2,2'-bis(o-methoxyphenyl)-4,4',5,5'-tetraphenylbiimidazole, 2,2'-bis(p-methoxyphenyl)-4,4'-bis(o-methoxyphenyl)-5,5'-diphenyl-biimidazole, 2,2'-bis(o-nitrophenyl)-4,4',5,5'-tetraphenyl-biimidazole, 2,2'-bis(p-phenylsulfonylphenyl)-4,4',5,5'-tetraphenyl-biimidazole, 2,2'-bis(p-sulfamoylphenyl)-4,4',5,5'-tetraphenylbiimidazole, 2,2'-bis(2,4,6-trimethylphenyl)4,4',5,5'-tetraphenyl-biimidazole, 2,2'-di-4-biphenylyl-4,4',5,5'2,2'-di-1-naphthyl-4,4',5,5'-tetrakis(p-methoxyphenyl)-biimidazole, 2,2'-di-9-phenanthryl-4,4',5,5'-tetrakis(p-methoxyphenyl)-biimidazole, 2,2'-diphenyl-4,4',5,5'-tetra-4-biphenylyl-biimidazole, 2,2'-diphenyl-4,4',5,5'-tetra-2,4-xylyl-biimidazole, 2,2'-di-3-pyridyl-4,4',5,5'-tetraphenyl-biimidazole, 2,2'-di-3-thienyl-4,4',5,5'-tetraphenyl-biimidazole, 2,2'-di-o-tolyl-4,4',5,5'-tetraphenylbiimidazole, 2,2'-di-p-tolyl-4,4'-di-o-tolyl-5,5'-diphenylbiimidazole, 2,2'-di-2,4-xylyl-4,4',5,5'-tetraphenylbiimidazole, 2,2',4,4',5,5'-hexakis(p-benzylthiophenyl)biimidazole, 2,2',4,4',5,5'-hexa-1-naphthylbiimidazole, 2,2',4,4',5,5'-hexaphenylbiimidazole, 2,2'-bis(2-nitro-5-methoxyphenyl)-4,4',5,5'-tetraphenyl-biimidazole, and 2,2'-bis(o-nitrophenyl)-4,4',5,5'-tetrakis(m-methoxyphenyl-biimidazole. 2,2'-bis(2-chloro-5-sulfophenyl)-4,4',5,5'-tetraphenyl-biimidazole.

The hexaarylbiimidazoles are conveniently obtained by known methods as more particularly described by British Pat. No. 997,396 and by Hayashi et al., Bull.Chem.Soc.Japan, 33, 565 (1960) and Cescon & Dessauer U.S. Pat. No. 3,445,234. The preferred method, involving oxidative dimerization of the corresponding triarylimidazole with ferricyanide in alkali, generally yields the 1-2'-hexaarylbiimidazoles, although other isomers, such as the 1,1',1,4',2,2',2,4'and 4,4'-hexaarylbiimidazoles are sometimes also obtained admixed with the 1,2'-isomer. For the purposes of this invention, it is immaterial which isomer is employed so long as it is photodissociable to the triarylimidazolyl radical, as discussed above.

The color generator is preferably a leuco dye. By the term "leuco dye" is meant the colorless (i.e., the reduced) form of a dye compound which may be oxidized to its colored form by the triarylimidazolyl radical.

Leuco dyes which may be oxidized to color by the triarylimidazolyl radicals generated from the compositions of this invention include: aminotriarylmethanes, aminoxanthenes, aminothioxanthenes, amino-9,10-dihydroacridines, aminophenoxazines, aminophenothiazines, aminodihydrophenazines, aminodiphenylmethanes, leuco indamines, aminohydrocinnamic acids (cyanoethanes, leuco methines), hydrazines, leuco indigoid dyes, amino-2,3-dihydroanthraquinones, tetrahalo-p,p'-biphenols, 2(p-hydroxyphenyl)4,5-diphenylimidazoles, phenethylanilines, and the like. These classes of leuco dyes are described in greater detail in Cescon & Dessauer U.S. Pat. No. 3,445,234; Cescon, Dessauer & Looney U.S. Pat. No. 3,423,427; Cescon, Dessauer & Looney U.S. Pat. No. 3,449,379; Read U.S. Pat. No. 3,395,018 and Read U.S. Pat. No. 3,390,997.

The preferred leucos are the aminotriarylmethanes. Preferably the aminotriarylmethane is one wherein at least two of the aryl groups are phenyl groups having (a) an $R_1R_2N$-substituent in the position para to the bond to the methane carbon atom wherein $R_1$ and $R_2$ are each groups selected from hydrogen, $C_1$ to $C_{10}$ alkyl, 2-hydroxyethyl, 2-cyanoethyl, benzyl or phenyl, and (b) a group ortho to the bond to the methane carbon atom which is selected from lower alkyl, lower alkoxy, fluorine, chlorine, bromine, or butadienylene which when joined to the phenyl group forms a naphthalene ring; and the third aryl group, when different from the first two, is selected from thienyl, furyl, oxazylyl, pyridyl, thiazolyl, indolyl, indolinyl, benzoxazolyl, quinolyl, benzothiazolyl, phenyl, naphthyl, or such aforelisted groups substituted with lower alkyl, lower alkoxyl, methylenedioxy, fluoro, chloro, bromo, amino, lower alkylamino, lower dialkylamino, lower alkylthio, hydroxy, carboxy, carbonamido, lower carbalkoxy, lower alkylsulfonyl, lower alkylsulfonamido, $C_6$ to $C_{10}$ arylsulfonamido, nitro or benzylthio. Preferably the third aryl group is the same as the first two.

Particularly preferred aminotriarylmethanes have the following structural formula:

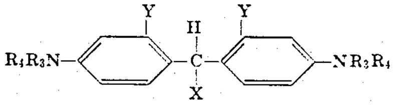

wherein $R_3$ and $R_4$ are selected from lower alkyl (preferably ethyl) or benzyl, Y and Y' are lower alkyl (preferably methyl) and X is selected from

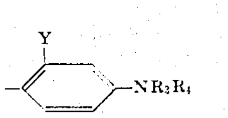

p-methoxyphenyl, 2-thienyl, phenyl, 1-naphthyl, 2,3-dimethoxyphenyl, 3,4-methylenedioxyphenyl, or p-benzothiophenyl. Preferably X is selected from

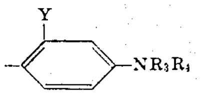

phenyl, 1-naphthyl, or p-benzothiophenyl.

These triarylmethanes are employed as salts of strong acids: for example, mineral acids such as hydrochloric, hydrobromic, sulfuric, nitric, phosphoric; organic acids such as acetic, oxalic, p-toluenesulfonic, trichloroacetic acid, trifluoroacetic acid, perfluoroheptanoic acid; and Lewis acids such as zinc chloride, zinc bromide, and ferric chloride; the proportion of acid usually varying from 1 to 20 moles per mole of leuco dye, preferably 4 to 10 moles per mole. The term "-strong acid" as used herein is defined as an acid which forms a salt with an anilino amino group.

Specific examples of the aminotriarylmethanes employed in this invention are: bis(4-amino-2-butylphenyl)(p-dimethylaminophenyl)methane bis(4-amino-2-chlorophenyl)(p-aminophenyl)methane bis(4-amino-3-chlorophenyl)(o-chlorophenyl)methane bis(4-amino-3-chlorophenyl)phenylmethane bis(4-amino-3,5-diethylphenyl)(o-chlorophenyl)methane bis(4-amino-3,5-diethylphenyl)(o-ethoxyphenyl)methane bis(4-amino-3,5-diethylphenyl)(p-methoxyphenyl)methane bis(4-amino-3,5-diethylphenyl)phenylmethane bis(4-amino-3-ethylphenyl)(o-chlorophenyl)methane bis(p-aminophenyl)(4-amino-m-tolyl)methane bis(p-aminophenyl)(o-chlorophenyl)methane bis(p-aminophenyl)(p-chlorophenyl)methane bis(p-aminophenyl)(2,4-dichlorophenyl)methane bis(p-aminophenyl)(2,5-dichlorophenyl)methane bis(p-aminophenyl)(2,6-dichlorophenyl)methane bis(p-aminophenyl)phenylmethane bis(4-amino-o-tolyl)(p-chlorophenyl)methane bis(4-amino-o-tolyl)(2,4-dichlorophenyl)methane bis(p-anilinophenyl)(4-amino-m-tolyl)methane bis(4-benzylamino-2-cyanophenyl)(p-aminophenyl)methane bis(p-benzylethylaminophenyl)(p-chlorophenyl)methane bis(p-benzylethylaminophenyl)(p-diethylaminophenyl)methane bis(p-benzylethylaminophenyl)(p-dimethylaminophenyl)methane bis(4-benzylethylamino-o-tolyl)(p-methoxyphenyl)methane bis(p-benzylethylaminophenyl)-phenylmethane bis(4-benzylethylamino-o-tolyl)(o-chlorophenyl)methane bis(4-benzylethylamino-o-tolyl)(p-diethylaminophenyl)methane bis(4-benzylethylamino-o-tolyl)(4-diethylamino-o-tolyl)methane bis(4-benzylethylamino-o-tolyl)(p-dimethylaminophenyl)methane bis[2-chloro-4-(2-diethylaminoethyl)ethylaminophenyl(o-chlorophenyl)methane bis[p-bis(2-cyanoethyl)aminophenyl]phenylmethane bis[p-(2-cyanoethyl)ethylamino-o-tolyl](p-dimethylaminophenyl)methane bis[p-(2-cyanoethyl)methylaminophenyl](p-diethylaminophenyl) methane bis(p-dibutylaminophenyl)[p-(2-cyanoethyl) methylaminophenyl]methane bis(p-dibutylaminophenyl) (p-diethylaminophenyl)methane bis(4-diethylamino-2-butoxyphenyl)(p-diethylaminophenyl)methane bis(4-diethylamino-2-fluorophenyl)o-tolylmethane bis(p-diethylaminophenyl)(p-aminophenyl)methane bis(p-diethylaminophenyl)(41-naphthyl)methane bis(p-diethylaminophenyl)(m-butoxyphenyl)methane bis(p-diethylaminophenyl)(o-chlorophenyl)methane bis(p-diethylaminophenyl)(p-cyanophenyl)methane bis(p-diethylaminophenyl)(2,4-dichlorophenyl)methane bis(p-diethylaminophenyl)(4-diethylamino-1-naphthyl)methane bis(p-diethylaminophenyl)(p-dimethylaminophenyl)methane bis(p-diethylaminophenyl)(4-ethylamino-1-naphthyl)methane bis(p-diethylaminophenyl)2-naphthylmethane bis(p-diethylaminophenyl)(p-nitrophenyl)methane bis(p-diethylaminophenyl)2-pyridylmethane bis(p-diethylamino-m-tolyl)(p-diethylaminophenyl)methane bis(4-diethylamino-o-tolyl)(o-chlorophenyl)methane bis(4-diethylamino-o-tolyl)(p-diethylaminophenyl)methane bis(4-diethylamino-o-tolyl)(p-diphenylaminophenyl)methane bis(4-diethylamino-o-tolyl)phenylmethane bis(4-dimethylamino-2-bromophenyl)phenylmethane bis(p-dimethylaminophenyl)(4-anilino-1-naphthyl)methane bis(p-dimethylaminophenyl)(p-butylaminophenyl)methane bis(p-dimethylaminophenyl)(p-sec. butylethylaminophenyl)methane bis(p-dimethylaminophenyl)(p-chlorophenyl)methane bis(p-dimethylaminophenyl)(p-diethylaminophenyl)methane bis(p-dimethylaminophenyl)(4-dimethylamino-1-naphthyl)methane bis(p-dimethylaminophenyl)(6-dimethylamino-m-tolyl)methane bis(p-dimethylaminophenyl)(4-dimethylamino-o-tolyl)methane bis(p-dimethylaminophenyl)(4-ethylamino-1naphthyl)methane bis(p-dimethylaminophenyl)(p-hexyloxyphenyl)methane bis(p-dimethylaminophenyl)(p-methoxyphenyl)methane bis(p-dimethylaminophenyl)(5-methyl-2-pyridyl)methane bis(p-dimethylaminophenyl) 2-quinolylmethane bis(p-dimethylaminophenyl) o-tolylmethane bis(p-dimethylaminophenyl)(1,3,3-trimethyl-2-indolinylidenemethyl)methane bis(4-dimethylamino-o-tolyl)(p-aminophenyl)methane bis(4-dimethylamino-o-tolyl)(o-bromophenyl)methane bis(4-dimethylamino-o-tolyl)(o-cyanophenyl)methane bis(4-dimethylamino-o-tolyl)(o-fluorophenyl)methane bis(4-dimethylamino-o-tolyl) 1-naphthylmethane bis(4-dimethylamino-o-tolyl)phenylmethane bis(p-ethylaminophenyl)(o-chlorophenyl)methane bis(4-ethylamino-m-tolyl)(o-methoxyphenyl)methane bis(4-ethylamino-m-tolyl)(p-methoxyphenyl)methane bis(4-ethylamino-m-tolyl)(p-dimethylaminophenyl)methane bis(4-ethylamino-m-tolyl)(p-hydroxyphenyl)methane bis[4-ethyl(2-hydroxyethyl)amino-m-tolyl](p-diethylamino-phenyl)methane bis[p-(2-hydroxyethyl)aminophenyl](o-chlorophenyl)methane bis[p(bis(2-hydroxyethyl)aminophenyl](4-diethylamino-o-tolyl)methane bis[p-(2-methoxyethyl)aminophenyl]phenylmethane bis(p-methylaminophenyl)(o-hydroxyphenyl)methane bis(p-propylaminophenyl)(m-bromophenyl)methane tris(4-amino-o-tolyl)methane tris(4-anilino-o-tolyl)methane tris(p-benzylaminophenyl)methane tris[4-bis(2-cyanoethyl)amino-o-tolyl]methane tris[p-(2-cyanoethyl)ethylaminophenyl]methane tris(p-dibutylaminophenyl)methane tris(p-di-n-butylaminophenyl)methane tris(4-diethylamino-2-chlorophenyl)methane tris(p-diethylaminophenyl)methane tris(4-diethylamino-o-tolyl)methane tris(p-dihexylamino-o-tolyl)methane tris(4-dimethylamino-o-tolyl)methane tris(p-hexylaminophenyl)methane tris[p-bis(2-hydroxyethyl)aminophenyl]methane tris(p-methylaminophenyl)methane tris(p-dioctadecylaminophenyl)methane tris(4-diethylamino-2-fluorophenyl)methane tris(4-dimethylamino-2-fluorophenyl)methane bis(2-bromo-4-diethylaminophenyl)phenylmethane, bis(2-butoxy-4-diethylaminophenyl)phenylmethane, bis(4-diethylamino-o-tolyl)(p-methoxyphenyl)methane, bis(4-diethylamino-2-methoxyphenyl)(p-nitrophenyl)methane, bis(4-diethylamino-1-naphthyl)(4-diethylamino-o-tolyl)methane, bis(4-diethylamino-o-tolyl)1-naphthylmethane, bis(4-diethylamino-o-tolyl)phenylmethane, tris(4-dimethylamino-2-chlorophenyl)methane, bis(4-dimethylamino-2,5-dimethylphenyl)phenylmethane, bis(4-dimethylamino-o-tolyl)(o-bromophenyl)methane, bis(4-ethylbenzylamino-o-tolyl)(p-methoxyphenyl)methane, tris(p-dioctylamino-o-tolyl)methane, bis(4-diethylamino-o-tolyl)-4-methoxy-1-naphthyl methane bis(4-diethylamino-o-tolyl)-3,4,5-trimethoxyphenyl methane bis(4-diethylamino-o-tolyl)-p-hydroxyphenyl methane 5-[bis(4-diethylamino-o-tolyl)-methyl]-2,3-cresotic acid 4-[bis(4-diethylamino-o-tolyl)-methyl]-phenol 4-[bis(4-diethylamino-o-tolyl)-methyl]-acetanilide 4-[bis(4-diethylamino-o-tolyl)-methyl]-phenylacetate 4-[bis(4-diethylamino-o-tolyl)-methyl]-benzoic acid 4-[bis(4-diethylamino-o-tolyl)-methyl]-diphenyl sulfone 4-[bis(4-diethylamino-o-tolyl)-methyl]phenylmethyl sulfone 4-[bis(4-diethylamino-o-tolyl)-methyl]-methylsulfonanilide 4-[bis(4-diethylamino-o-tolyl)-methyl]-p-tolylsulfonanilide bis(4-diethylamino-o-tolyl)-p-nitrophenyl methane bis(4-diethylamino-o-tolyl)(2-diethylamino-4-methyl-5-thiazolyl) methane bis(4-diethylamino-o-tolyl)(2-diethylamino-5-methyl-6-benzoxazolyl) methane bis(4-diethylamino-o-tolyl)(2-diethylamino-5-methyl-6-benzothioazolyl) methane bis(4-diethylamino-o-tolyl)(1-ethyl-2-methyl-3-indolyl) methane bis(4-diethylamino-o-tolyl)(1-benzyl-2-methyl-3-indolyl) methane bis(4-diethylamino-o-tolyl)(1-ethyl-2-methyl-5-methoxyl-3-indolyl)methane bis(1-o-xylyl-2-methyl-3-indolyl)(4-diethylamino-o-tolyl)methane bis(4-diethylamino-o-tolyl)(1-ethyl-5-indolinyl)methane bis(1-isobutyl-6-methyl-5-indolinyl)(4-diethylamino-o-tolyl) methane bis(4-diethylamino-o-tolyl)(8-methyl-9-julolindinyl)methane bis(4-diethylamino-2-acetamidophenyl)(4-diethylamino-o-tolyl) methane 4-[bis(4-diethylamino-o-tolyl)methyl]-N-ethylacetanilide bis[4-(1-phenyl-2,3-dimethyl-5pyrazolinyl)](4-diethylamino-o-tolyl)methane bis(4-diethylamino-o-tolyl)(7-diethylamino-4-methyl-3-coumarinyl)methane bis(4-diethylamino-o-tolyl)(4-acrylamidophenyl)methane bis(4-diethylamino-o-tolyl)(p-benzylthiophenyl)methane bis(4-diethylamino-o-tolyl)(4-isopropylthio-3-methylphenyl)methan bis(4-diethylamino-o-tolyl)(4-chlorobenzylthiophenyl)methane bis(4-diethylamino-o-tolyl)(2-furyl)methane bis(4-diethylamino-o-tolyl)(3,4-methylenedioxyphenyl)methane bis(4-diethylamino-o-tolyl)(3,4-dimethoxyphenyl)methane bis(4-diethylamino-o-tolyl)(3-methyl-2-thienyl)methane bis(4-diethylamino-o-tolyl)(2,4-dimethoxyphenyl)methane bis[4-(2-cyanoethyl)(2-hydroxyethyl(amino-o-tolyl]-(p-benzylthiophenyl)methane, bis[4-(2-cyanoethyl)( 2-hydroxyethyl)amino-o-tolyl]-2-thienylmethane, bis(4-dibutylamino-o-tolyl)2-thienylmethane, bis(4-diethylamino-2-ethylphenyl)(3,4-methylenedioxyphenyl)methane, bis(4-diethylamino-2-fluorophenyl)(p-benzylthiophenyl)methane, bis(4-diethylamino-2-fluorophenyl)(3,4-methylenedioxyphenyl)methane, bis(4-diethylamino-o-tolyl)(p-methylthiophenyl)methane, bis(4-diethylamino-o-tolyl)2-thienylmethane, bis(4-dimethylamino-2-hexylphenyl)(p-butylthiophenyl)methane, bis[4-(N-ethylanilino)-o-tolyl](3,4-dibutoxyphenyl)methane, bis[4-bis(2-hydroxyethyl)amino-2-fluorophenyl](p-benzylthiophenyl)methane, bis(4-diethylamino-o-tolyl)-p-chlorophenyl methane, bis(4-diethylamino-o-tolyl)-p-bromophenyl methane, bis(4-diethylamino-o-tolyl)-p-fluorophenyl methane, bis(4-diethylamino-o-tolyl)-p-tolyl methane, bis(4-diethylamino-o-tolyl)-4-methoxy-1-naphthyl methane, bis(4-diethylamino-o-tolyl)-3,4,5-trimethoxyphenyl methane, bis(4-diethylamino-o-tolyl)-p-hydroxyphenyl methane, bis(4-diethylamino-o-tolyl)-3-methylthienyl methane.

The deactivating component of the photosensitive composition comprises a second photoactivatable oxidant and a reductant. The deactivating component is sometimes referred to as a "redox couple." Preferably the second photoactivatable oxidant is a quinone, e.g., pyrenequinone or phenanthrenequinone; and the reductant is a polyether, or a compound of the formula $N[(CH_2)_nCOOR]_3$ wherein n is the integer 1 or 2 and R is lower alkyl. Most preferably the deactivating components are a polynuclear quinone absorbing principally in the 430–550 mu region such as 1,6-pyrenequinone, 1,8-pyrenequinone, 9,10phenanthrenequinone and mixtures thereof, most preferably 9,10-phenanthrenequinone; while the reductant member is preferably a $C_1$ to $C_4$ alkyl ester of nitrilotriacetic acid or of 3,3',3''-nitrilotripropionic acid, most preferably trimethyl nitrilotripropionate.

These deactivating components are responsive to visible light and preferably to light rich in wavelengths between 380 and 460 mu.

Thus compositions useful in the invention include these described in MacLachlan U. S. Pat. No. 3,390,996, issued July 2, 1968 which composition disclosure is incorporated herein by reference. Particularly preferred is the composition embodiment described in column 3, line 68 through column 4, line 2 of the patent wherein the color generator is an aminotriarylmethane containing at least two p-dialkylamino-substituted phenyl groups having as a substituent ortho to the methane carbon atom an alkyl, alkoxy or halogen, the first photoactivatable oxidant is a 2,2'(o-substituted phenyl)-4,4',5,5'-tetraphenyl biimidazole, the second photoactivatible (the oxidant of said patent) oxidant redox couple is a quinone and the reductant component (of the redox couple of the patent) is a polyether. The ortho-substituents on the 2 and 2'-phenyl groups are preferably F, Cl, Br, alkyl, alkoxyl, or benzo. These preferred compositions and the components thereof are described in said patent in column 4, line 56 to column 5, line 4; column 8, lines 34 to 56; column 11 , lines 11–19; and column 12, lines 21–23; each incorporated herein by reference.

The compositions useful herein also include those compositions described in Cescon U. S. Pat. No. 3,390,994, issued July 2, 1968 which composition disclosure is incorporated herein by reference. In particular the embodiment described in column 2, lines 51 through 64 is incorporated herein by reference. This embodiment consists essentially of an intimate admixture of (a) a salt of an acid and the leuco form of a triphenylmethane dye having, in at least two of the phenyl rings positioned para to the methane carbon atom, a $C_1$ to $C_4$ dialkyl amino substituent, (b) a 2,2',4,4',5,5'-hexaarylbiimidazole wherein the aryl groups are alike or different and preferably have an ortho substituent in the 2, and 2'-aryl groups selected from the group consisting of chlorine, bromine, fluorine, lower alkoxy, methyl, and benzo, and (c) a redox couple which consists of (1) a pyrenequinone or phenanthrenequinone as oxidant and (2) a compound having the general formula $N[CH_2)_nCOOR]_3$, wherein *n* is the integer 1 or 2 and R is a straight chain lower alkyl as reductant. Component (a) and (b) form the color generator portion of the photosensitive composition, while component (c) forms the deactivating portion of the composition. Representative specific components specifically incorporated by reference herein are those found in column 3, line 21 to column 5, line 37 of said patent.

The deactivating portion of the composition of the previous paragraph may be replaced by a mixture of 1,6- and 1,8-pyrenequinone (in amounts of 0.04 to 0.4 mole per mole of biimidazole), either 9,10-phenanthrenequinone, perinaphthenone, or 4-methoxy-1,2-naphthoquinone (in an amount of 0.04 to 2 moles per mole of biimidazole); and an ether containing at least one oxymethylene group wherein the methylene bears at least one hydrogen, e.g.

$$(CH_2)_nR'$$

where $n$ is 0–1, $m$ is $$RO-(CH_2CH-O)_m-R$$

1 to 15, R is hydrogen, alkyl, phenyl, alkylphenyl, biphenylyl or acyl, R' is H when *n* is zero and is H, OH or R when *n* is 1.

A preferred photoimageable/photodeactivatable composition is:

A. color-forming (imaging) components (1) a salt of a leuco triarylmethane and a salt forming acid; and (2) a hexaarylbiimidazole which absorbs principally in the ultraviolet region and is a photooxidant for the salt of the leuco triarylmethane; and B. deactivating (image fixing) components (3) a second photooxidant (preferably a polynuclear quinone) which is activatable at longer wavelengths, e.g. visible light, than those required to activate the biimidazole, does not photooxidize leuco dye to dye, and is reducible in its photoactivated state to a second reductant; and (4) a first reductant (preferably an ether having abstractable hydrogen, an ester having abstractable hydrogen, a lower alkyl nitrilotriacetate or a lower alkyl 3,3',3''-nitrilotripropionate) which is a reductant for the photoactivated second oxidant but is not a reductant for the photoactivated biimidazole, said first reductant reducing the photoactivated second oxidant to the second reductant, said second reductant being a reductant for the activated biimidazole whereby it prevents the color-forming reaction between the activated biimidazole and leuco dye.

Ratio of Reactants

The molar ratio of biimidazole photooxidant to aminotriarylmethane color-generator may vary from about 0.1:1 to about 10:1. The preferred range is from 1:1 to 2:1.

The quinone component of the redox couple is based on the biimidazole molar ratios of from 0.01:1 to 2:1 may be employed with ratios of 0.2:1 to 0.5:1 being preferred. The reductant component (e.g., trimethyl 3,3',3''-nitrilotripropionate) of the redox couple (deactivating component) is employed in molar ratios of from about 1:1 to about 40:1 based on the quinone component.

Other components

Polymeric binders may also be present in the photosensitive compositions to thicken them or adhere them to substrates. Binders can also serve as a matrix for the composition and the mixture may be cast, extruded or otherwise formed into unsupported imageable films. Light-transparent and film-forming polymers, are preferred. Examples are ethyl cellulose, polyvinyl alcohol, polyvinyl chloride, polystyrene, polyvinyl acetate, poly-(methyl methacrylate), cellulose acetate, cellulose butyrate, cellulose acetate butyrate, cellulose nitrate, chlorinated rubber, co-polymers of the above vinyl monomers, and gelatin. Binder or matrix amounts vary from about 0.5 part to about 200 parts by weight per part of combined weight of leuco dye and hexaarylbiimidazole. In general, from 0.5 to 10 parts are used as adhesive or thickener, while higher amounts are used to form the unsupported films. With certain polymers, it may be desirable to add a plasticizer to give flexibility to the film or coating. Plasticizers include the polyethylene glycols such as the commercially available carbowaxes, and related materials, such as substituted phenolethylene oxide adducts, for example the polyethers obtained from o-, m- and p-cresol, o-, m- and p-phenylphenol and p-nonylphenol, including commercially available materials such as the Igepal alkyl phenoxy polyoxyethylene ethanols. Other plasticizers are the acetates, propionates butyrates and other carboxylate esters of ethylene glycol, diethylene-glycol, glycerol, pentaerythritol and other polyhydric alcohols, and alkyl phthalates and phosphates such as dimethyl phthalate, diethyl phthalate, dioctyl phthalate, tributyl phosphate, trihexyl phosphate, trioctyl phosphate, triphenyl phosphate, tricresyl phosphate and cresyl diphenyl phosphate.

Substrates

For imaging according to this invention, the composition may be coated upon or impregnated in substrates following known techniques. Substrates include materials commonly used in the graphic arts and in decorative applications such as paper ranging from tissue paper to heavy cardboard, films of plastics and polymeric materials such as regenerated cellulose, cellulose acetate, cellulose nitrate, polyester of glycol and terephthalic acid, vinyl polymers and co-polymers, polyethylene, polyvinylacetate, polymethyl methacrylate, polyvinylchloride; textile fabrics; glass, wood and metals. The composition, usually as a solution in a carrier solvent described above may be sprayed, brushed, applied by a roller or an immersion coater, flowed over the surface, picked up by immersion or spread by other means, and the solvent evaporated. In general, solvents are employed which are volatizing at ordinary pressures. Examples are amides such as N,N-dimethylformamide and N,N-dimethylacetamide; alcohols and ether alcohols such as methanol, ethanol, 1-propanol, 2-propanol, butanol, and ethylene glycol; esters such as methyl acetate and ethyl acetate; aromatics such as benzene, o-dichlorobenzene, toluene; ketones such as acetone, methyl ethyl ketone, 3-pentanone; aliphatic halocarbons such as methylene chloride, chloroform, 1,1,2-trichloroethane, 1,1,2,2-tetrachloroethane, 1,1,2-trichloroethylene; miscellaneous solvents such as dimethylsulfoxide, pyridine, tetrahydrofuran; dioxane, dicyanocyclobutane, 1-methyl-2-oxohexamethyleneimine; and mixtures of these solvents in various proportions as may be required to attain solutions. It is often beneficial to leave a small residue of solvent in the dried composition so that the desired degree of imaging can be obtained upon subsequent irradiation. Ordinary drying such as that employed in paper manufacture or in film casting results in the retention of ample solvent to give a composition with good photosensitivity. The compositions so produced are dry to the touch and stable to storage at room temperature. Indeed, moisture of the air is absorbed by many of the compositions, particularly those comprising an acid salt of an amino leuco form of a dye on cellulosic substrates, and serves as a suitable solvent.

Examples

The invention, various embodiments thereof, and the advantages it provides are further illustrated by the examples below.

EXAMPLE 1

The photosensitive paper utilized below was obtained as follows:

A coating composition was prepared from the following ingredients:

| | |
|---|---|
| 54 ml | acetone |
| 6 ml | 2-propanol |
| 0.4180 g. | 2,2'-bis(o-chlorophenyl)-4,4',5,5'-tetrakis(m-methoxyphenyl)biimidazole (5.36 $\times 10^{-4}$ mole) |
| 0.0900 g. | tris(4-diethylamino-o-tolyl)methane (1.8 $\times 10^{-5}$ mole) |
| 0.400 g. | p-toluenesulfonic acid monohydrate (2.1 $\times 10^{-3}$ mole) |
| 1.0 ml | trimethyl 3,3',3''-nitrilotripropionate (4.2 $\times 10^{-3}$ mole) |
| 0.054 g. | 9,10-phenanthrenequinone (2.6 $\times 10^{-4}$ mole) |
| 6.0 g. | cellulose acetate butyrate (thermoplastic binder, employed as Eastman EAB-171-40) |
| 3.0 g. | polyethyleneoxide adduct of o-phenylphenol prepared from 2.25 moles of ethylene oxide per mole of the phenol and having the average formula $C_6H_5$-$C_6H_4$-$O(CH_2CH_2O)_{2.25}H$. |

A high holdout calendared bleached sulfite paper was coated with the above composition. The paper was dried under hot forced air to a non-tacky surface.

A blowback system was constructed substantially as illustrated in FIGS. 1 to 3 using a 35 mm projector, an ordinary viewing screen and a Blacklite blue fluorescent (low intensity ultraviolet) lamp. The color temperature of projector lamp was 3,200° K at the source and provided white light at 800 foot candles of illumination at the screen at a screen to lamp distance affording a 10X enlargement of a 35 mm slide image (silver on polyester film base). The ultraviolet lamp was positioned outside the projected lamp light beam and directed so as to irradiate the screen over the projected lamp light area with an irradiance of 0.2 milliwatt/cm² at the screen surface.

To demonstrate the method of the invention, a sheet of photosensitive paper, described above, was placed over the screen, with the projector and Blacklite lamps off. Both lamps were then turned on at the same time for 30 seconds, then turned off. The thus exposed paper showed a blue image having a reflectance optical density of 0.37 against a pale yellow background having a reflectance optical density of 0.15. The contrast between the colored and background areas was judged good. The pale yellow background, which is resistant to ambient light induced color formation and which owes its yellow cast to the presence of phenanthrenequinone in the photosensitive composition, gradually bleaches to white on further exposure to roomlight, daylight or sunlight.

In comparison, when the same (unexposed) paper was subjected to the same exposure but sequentially, first with the projector lamp for 30 seconds, followed by an overall irradiation with the ultraviolet light for another 30 seconds, the resulting image optical density was 0.32 (somewhat lower), the background optical density 0.19 (significantly higher), and the contrast was only fair (inferior).

EXAMPLE 2

Example 1 was repeated with a 16 mm microfilm projector having a f1.6 lens with a 1.5 inch focal length and fitted with a General Electric 200-watt EJL lamp and two 0.25 inch thick sheets of heat-absorbing glass. The visible light transmitted through the transparent regions of the microfilm provided 700 foot candles at the imaging plane of the screen, which was distanced for a 21 times enlargement. Each of two blacklite blue lamps was positioned just outside the imagewise projected visible beam and directed so as to irradiate the entire imaging plane with ultraviolet light at an irradiance at the plane of 0.28 milliwatt/cm².

Samples of photosensitive paper described in Example 1 were co-irradiated for different times as noted below. The results are expressed below as the reflectance optical densities of the blue imaged area (struck by UV only) and the background area (co-struck, deactivated).

Co-Irradiation For 21X Hard Copy Blowback 0.28 mw/cm² ultraviolet 700 foot candles visible

| Time Seconds | OD Image | OD Bkgd. | ΔOD |
|---|---|---|---|
| 5 | 0.12 | 0.08 | 0.04 |
| 10 | 0.20 | 0.09 | 0.11 |
| 15 | 0.29 | 0.09 | 0.20 |
| 20 | 0.34 | 0.10 | 0.24 |
| 25 | 0.41 | 0.11 | 0.30 |
| 30 | 0.47 | 0.13 | 0.34 |
| 40 | 0.56 | 0.13 | 0.43 |
| 50 | 0.63 | 0.15 | 0.48 |
| 60 | 0.68 | 0.15 | 0.48 |
| 120 | 0.83 | 0.19 | 0.64 |

The results show that while the optical density of the blue image increases with increasing exposure, that of the co-struck area increases to a much lesser extent. In fact, as the background optical densities indicate, little or no color due to blue dye formation occurred in the presence of the visible light.

That the above co-irradiated papers are to a large practical extent deactivated against color formation on exposure to stray ultraviolet light can be shown on prolonged exposure to roomlight, daylight and sunlight.

EXAMPLE 3

High quality imaged and fixed hard copy is also obtained under the above co-irradiation conditions on employing a photosensitive paper prepared as described in Example 1 but modified as follows:

The quantity of the 2,2'-bis(o-chlorophenyl)-4,4',5,5'-tetrakis(m-methoxy-phenyl)biimidazole was decreased to 0.334 grams (a 20 percent decrease), that of the 9,10-phenanthrenequinone increased to 0.065 grams (a 20 percent increase).

With this composition there is a reduced amount of color formation in the background areas co-struck under the described exposures.

EXAMPLE 4

A microfilm blowback device was constructed as illustrated in FIGS. 2, 3 and 4. A 16 mm microfilm projector was fitted with a 300 arc type lamp emitting over the near ultraviolet and visible regions of the spectrum; a Corning C.S. 5–57 filter (a band pass filter, which passes light over the range 360 to 500 mm, with peaking at 420 mμ) was immersed in a water-filled cell and placed between the lamp and the film gate. The projector was adjusted to project a 21.3 enlargement onto a suitably placed near white viewing screen. Projected with the filtered light the film's silver-on-polyester image appeared on the viewing screen as black on a bright blue field, having a phototropic illumination reading of approximately 500–600 foot candles, the image being pleasing to the eye and clearly discernible under ordinary room lighting conditions. Two banks of tubular Blacklite blue fluorescent lamps with reflectors (4 tubes in each bank) were positioned on opposite sides of the viewing screen, just outside the projected light beam, about 5 inches from the screen and directed to completely overlap the projected lamp light area with ultraviolet light, the total ultraviolet radiation being about 1 mw/cm².

With the projector and the fluorescent lamps off, a sheet of photosensitive paper of Example 1 was placed over the projected area of the screen. Simultaneously, the projector lamp and the fluorescent lamps were turned on, then after 10 seconds, turned off. The thus exposed paper now bore a 21.3 times enlargement of the microfilm image as a clear blue image corresponding to colored area 8 of FIGS. 1 and 3) on a pale yellow deactivated background (corresponding to co-struck area 7 of FIGS. 1 and 3).

In comparison with the results obtained in the above exemplified method of the invention, when another sample of the same photosensitive paper was imaged and fixed sequentially, by first exposing it to the projected lamp light for 10 seconds to form a "latent" image, followed by an overall exposure to the ultraviolet light from the same fluorescent lamps to develop the image to the same optical density, the resulting image was clearly readable, but the deactivated background was noticeably more colored (bluish) and the contrast between the colored and deactivated areas was diminished.

EXAMPLE 5

The apparatus and general procedure of Example 4 was employed to co-irradiate photosensitive paper described in Example 1. The exposure conditions and the results, along with comparative data obtained by sequential irradiation under the same conditions, are given below.

CO-IRRADIATION FOR 21X HARD COPY BLOWBACK VISIBLE LIGHT—600 FOOT CNADLES ULTRAVIOLET LIGHT—AS BELOW EXPOSURE TIME—AS BELOW

| Run | Mode of irradiation | U.V. mw./cm.² | Time sec. | O.D. image | O.D. bkgd. | ΔO.D. |
|---|---|---|---|---|---|---|
| 1 | Co- | 2.0 | 10 | 0.84 | 0.40 | 0.44 |
| | Sequential | 2.0 | 10 | 0.85 | 0.58 | 0.27 |
| 2 | Co- | 1.5 | 5 | 0.34 | 0.02 | 0.32 |
| | Sequential | 1.5 | 5 | 0.31 | 0.01 | 0.30 |
| 3 | Co- | 1.5 | 10 | 0.64 | 0.11 | 0.53 |
| | Sequential | 1.5 | 10 | 0.64 | 0.30 | 0.34 |
| 4 | Co- | 1.5 | 15 | 0.77 | 0.12 | 0.65 |
| | Sequential | 1.5 | 15 | 0.78 | 0.41 | 0.37 |
| 5 | Co- | 1.25 | 10 | 0.64 | 0.06 | 0.58 |
| | Sequential | 1.25 | 10 | 0.63 | 0.22 | 0.41 |
| 6 | Co- | 0.76 | 20 | 0.61 | 0.03 | 0.58 |
| | Sequential | 0.76 | 20 | 0.60 | 0.05 | 0.55 |
| 7 | Co- | 0.76 | 30 | 0.71 | 0.01 | 0.70 |
| | Sequential | 0.76 | 30 | 0.71 | 0.18 | 0.35 |
| 8 | Co- | 0.76 | 40 | 0.80 | 0.02 | 0.78 |
| | Sequential | 0.76 | 40 | 0.78 | 0.18 | 0.50 |

The results show that co-irradiation produces less background color with better contrast (greater ΔOD) than sequential irradiation; and that hard copy access time can be materially decreased (effectively halved) by applying the color-inducing and the deactivating radiations at the same time.

EXAMPLE 6

Example 5 was repeated using a photosensitive paper described below and exposure conditions as tabulated below:

| Run | Irradiation | U.V. intensity, mw./cm.² | Time, sec. | O.D., image | O.D., bkgd. | ΔO.D. |
|---|---|---|---|---|---|---|
| 1 | Co- | 0.75 | 10 | 0.47 | 0.20 | 0.27 |
| | Sequential | 0.75 | 10 | 0.43 | 0.20 | 0.23 |
| 2 | Co- | 0.50 | 10 | 0.27 | 0.04 | 0.23 |
| | Sequential | 0.50 | 10 | 0.21 | 0.05 | 0.16 |
| 3 | Co- | 0.50 | 30 | 0.61 | 0.10 | 0.51 |
| | Sequential | 0.50 | 30 | 0.68 | 0.21 | 0.47 |
| 4 | Co- | 0.57 | 60 | 0.85 | 0.25 | 0.60 |
| | Sequential | 0.57 | 60 | 0.87 | 0.37 | 0.50 |

The photosensitive paper was prepared from the following coating composition:

| Ingredients | Parts | Molar Proportions |
|---|---|---|
| Acetone | 46.0 | — |
| Cellulose acetate butyrate | 6.0 | — |
| p-Nonylphenol-ethylene oxide adduct, $C_9H_{19}CH_4O(CH_2CH_2O)_{1.5}H$ | 4.0 | 92 |
| tris(p-diethylaminoethyl-o-tolyl)methane | 0.300 | 0.75 |
| p-Toluenesulfonic acid monohydrate | 0.344 | 2.25 |
| 2,2'-bis(o-Chlorophenyl)-4,4',5,5'-tetrakis(m-methoxyphenyl)-biimidazole | 0.624 | 1.00 |

| | | |
|---|---|---|
| 1,6- and 1,8-Pyrenequinones, added as a 1:1 mixture | 0.0371 | 0.2 |
| 35 9,10-Phenanthrenequinone | 0.0664 | 0.4 |

The solution was applied to bleached-sulfite roll stock paper and the acetone allowed to evaporate to give a coating about 0.4 mil thick.

EXAMPLE 7

The purpose of this example is to illustrate the versatility of the invention method and of the viewer-printer described in FIG. 4. The above exemplified image-fix system is modified to contain a 5 inch wide roll of the photosensitive paper, a means for feeding the roll stock over the face of the viewing screen, a means for cutting the roll stock into 5 inch square sheets, and a means for recovering the co-irradiated (hard copy) paper from the viewer-printer.

With no paper being fed into the projected area of the viewing screen, the projector lamp is turned on to project onto the screen a black image on a bright blue background, 21.3 times enlarged. This pre-printing viewing enables the viewer to observe the quality and positioning of the image to be copied and to make adjustments if necessary before printing. To print out the image as hard copy, the fluorescent lamps are turned on and simultaneously the roll stock feed is started, feeding the photosensitive paper at a rate of 12 inches/sec. and placing a sheet of the paper between the screen and the projected lamp light area in about 1 second. After a 10-second exposure, the sheet is recovered as hard copy showing a sharp blue image on a clear deactivated background.

EXAMPLE 8

Good quality readable hard copy — as a 21.3 times enlarged black image on a pale yellow background — is likewise obtained on repeating Example 4 with a photosensitive paper prepared from a coating composition which contains the same ingredients described in Example 1 except that the 0.0900 gram of tris(4-diethylamino-o-tolyl)methane is replaced by 0.1706 gram of bis(4-diethylamino-o-tolyl)3,4-dimethoxyphenyl methane.

EXAMPLE 9

Readable hard copy blowback is also obtained on employing the conditions of Example 5 to image and fix a photosensitive paper obtained by coating a paper substrate with the following solution and evaporating the carrier solvent:

| Ingredients | Parts by weight |
|---|---|
| Acetone | 41.4 |
| 2-Propanol | 4.6 |
| Cellulose acetate butyrate (thermoplastic binder)* | 6.0 |
| $P\text{-}C_9H_{19}\text{-}C_6H_4\text{-}O(CH_2CH_2O)_{1.5}H$ (plasticizer, obtained by condensing p-nonylphenyl with 1.5 moles of ethylene oxide) | 4.0 |
| Tris (4diethylamine-o-tolyl)methane | 0.30 |
| 2,2'-bis(o-chlorophenyl)-4,4',5,5'-tetrakis (m-methoxyphenyl)biimidazole | 0.62 |
| p-Toluenesulfonic acid monohydrate | 0.34 |
| An approx. 1:1 mixture of 1,6- and 1,8-pyrenequinone | 0.37 |

employed as Eastman EAB-531-1

EXAMPLE 10

Readable hard copy is also obtained on repeating Example 4 with a photosensitive paper prepared by coating a paper substrate with the following solution and evaporating the solvent:

| Ingredients | Parts by weight |
|---|---|
| Acetone | 48 |
| Cellulose acetate butyrate (Eastman EAB-171-40) | 6 |
| $O\text{-}C_6H_5\text{-}C_6H_4\text{-}O(CH_2CH_2O)_{2.3}H$ (Prepared by condensing o-phenyl phenol with 2.3 moles of ethylene oxide) | 5.5 |
| bis(p-diethylamino-o-tolyl)3,4-dimethoxyphenyl methane | 0.190 |
| bis(p-diethylamino-o-tolyl)phenyl methane | 0.207 |
| 2,2'-bis(o-chlorophenyl)-4,4',5,5'-tetrakis (m-methoxyphenyl)biimidazole | 0.780 |
| p-toluenesulfonic acid monohydrate | 0.342 |
| 9,10-phenanthrenequinone | 0.125 |

EXAMPLE 11

Similar results are also obtained on repeating Example 1 with the same photosensitive formulation coated on a polyester film base.

The preceding representative Examples may be varied within the scope of the present total specification disclosure, as understood and practiced by one skilled in the art, to achieve essentially the same results.

The foregoing detailed description has been given for clearness of understanding only and no unnecessary limitations are to be understood therefrom. The invention is not limited to the exact details shown and described, for obvious modifications will occur to those skilled in the art.

I claim:

1. Apparatus for forming a positive image in a photosensitive composition which comprises, in combination,
   1. means for positioning a photosensitive composition so as to present an image-receptive surface,
   2. a first photoradiation source and means for directing said photoradiation in a color-forming wavelength in a substantially uniform flux density over the entire surface of the photosensitive composition,
   3. a second photoradiation source and means for directing said photoradiation in a deactivating wavelength range in a substantially uniform flux density over the entire surface of the photosensitive composition,
   4. a radiation modulating means interposed between the surface of the photosensitive composition and the photoradiation from the second source so as to create a pattern of said photoradiation on said surface, said modulating means containing areas which are essentially transparent to said second radiation and areas which are essentially opaque to said radiation, said first and second radiation sources and directing means and said modulator being positioned with respect to the surface of the photosensitive composition and to each other such that
   a. both radiations in the absence of the modulator can irradiate the same total surface area to be imaged, and
   b. the modulator screens a positive image-creating portion of said second radiation without screening the first radiation from the photosensitive surface of said composition.

2. The apparatus of claim 1 wherein the first radiation source is an ultraviolet source, the ultraviolet light including wavelengths usable by said photosensitive composition for color formation the second radiation source is a visible light source, the visible light including wavelengths usable by the photosensitive composition for deactivation, the modulator is an image-bearing film, a stencil or an electronically or magnetically controlled light valve for generating optical characters, there are also present interposed between the visible light source and the modulator (i) an optical filter that screens out wavelengths of light other than said usable wavelengths and (ii) a means for absorbing infrared radiation components from said visible light radiation sufficient to prevent thermal destruction of said modulator.

3. The apparatus of claim 1, said photosensitive composition being a photoimageable and photodeactivatable composition.

4. The apparatus of claim 3, said photoimageable and photodeactivatable composition comprising an admixture of A. a color-forming component comprising (1) an organic color generator and (2) a photoactivatable first oxidant which can oxidize the color generator to a colored compound on irradiating the said first oxidant with light of a first wavelength range, and B. a deactivating component comprising (1) a second photoactivatable oxidant which is activatable by light of a second wavelength range, is not an oxidant for the color generator but is reducible when activated by light of said second wavelength range, and (2) a reductant which is a reductant for the second oxidant but not for the first oxidant, said reductant being capable of reducing the second oxidant on irradiation by light of said second wavelength range to a second reductant which is a reductant for the photoactivated first oxidant, whereby the second reductant prevents the color forming reaction between the color generator and the first oxidant.

5. The apparatus of claim 2, said photosensitive composition being a photoimageable and photodeactivatable composition.

6. The apparatus of claim 5, said photoimageable and photodeactivatable composition comprising an admixture of A. a color-forming component comprising (1) an organic color generator and (2) a photoactivatable first oxidant which can oxidize the color generator to a colored compound on irradiating the said first oxidant with light of a first wavelength range, and B. a deactivating component comprising (1) a second photoactivatable oxidant which is activatable by light of a second wavelength range, is not an oxidant for the color generator but is reducible when activated by light of said second wavelength range, and (2) a reductant which is a reductant for the second oxidant but not for the first oxidant, said reductant being capable of reducing the second oxidant on irradiation by light of said second wavelength range to a second reductant which is a reductant for the photoactivated first oxidant, whereby the second reductant prevents the color forming reaction between the color generator and the first oxidant.

* * * * *